US008765516B2

(12) United States Patent
Anderson et al.

(10) Patent No.: US 8,765,516 B2
(45) Date of Patent: Jul. 1, 2014

(54) LOW COST SOLAR CELL MANUFACTURE METHOD EMPLOYING A REUSABLE SUBSTRATE

(71) Applicant: International Business Machines Corporation, Armonk, NY (US)

(72) Inventors: Brent A. Anderson, Jericho, VT (US); Edward J. Nowak, Essex Junction, VT (US); Jed H. Rankin, South Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/761,371

(22) Filed: Feb. 7, 2013

(65) Prior Publication Data

US 2013/0146139 A1 Jun. 13, 2013

Related U.S. Application Data

(62) Division of application No. 12/951,601, filed on Nov. 22, 2010, now Pat. No. 8,609,453.

(51) Int. Cl.
*H01L 21/00* (2006.01)

(52) U.S. Cl.
USPC .............................. 438/57; 438/68

(58) Field of Classification Search
CPC ............ H01L 31/1804; H01L 21/76254; H01L 31/068; H01L 21/02532; H01L 21/2007; H01L 31/1892; H01L 21/02381; H01L 21/76259; H01L 21/0245; H01L 21/02032
USPC ....................... 257/431; 438/57, 68
See application file for complete search history.

(56) References Cited

U.S. PATENT DOCUMENTS

| | | | |
|---|---|---|---|
| 4,727,047 A | 2/1988 | Bozler et al. | |
| 4,816,420 A | 3/1989 | Bozler et al. | |
| 4,904,611 A | 2/1990 | Chiang et al. | |
| 5,336,335 A | 8/1994 | Hall et al. | |
| 5,549,747 A | 8/1996 | Bozler et al. | |
| 5,588,994 A | 12/1996 | Bozler et al. | |
| 5,665,607 A | 9/1997 | Kawama et al. | |
| 6,294,724 B1 | 9/2001 | Sasaoka et al. | |
| 6,331,208 B1 | 12/2001 | Nishida et al. | |
| 6,555,443 B1 | 4/2003 | Artmann et al. | |
| 6,664,169 B1 | 12/2003 | Iwasaki et al. | |
| 6,940,008 B2 | 9/2005 | Shiotsuka et al. | |

(Continued)

OTHER PUBLICATIONS

Final Office Action dated May 22, 2013 in U.S. Appl. No. 12/951,601; 20 Pages.

(Continued)

*Primary Examiner* — Kimberly Rizkallah
*Assistant Examiner* — Duy T Nguyen
(74) *Attorney, Agent, or Firm* — Michael Le Strange; Roberts Mlotkowski Safran & Cole, P.C.

(57) ABSTRACT

A reusable substrate and method for forming single crystal silicon solar cells are described. A method of forming a photovoltaic cell includes forming an intermediate layer on a monocrystalline silicon substrate, forming a monocrystalline silicon layer on the intermediate layer, and forming electrical features in the monocrystalline silicon layer. The method further includes forming openings in the monocrystalline silicon layer, and detaching the monocrystalline silicon layer from the substrate by selectively etching the intermediate layer through the openings.

16 Claims, 7 Drawing Sheets

(56) References Cited

U.S. PATENT DOCUMENTS

| | | |
|---|---|---|
| 7,309,620 B2 | 12/2007 | Fonash et al. |
| 2002/0000242 A1* | 1/2002 | Matushiita et al. ............ 136/244 |
| 2002/0017642 A1* | 2/2002 | Mizushima et al. ............ 257/19 |
| 2004/0198026 A1 | 10/2004 | Chu et al. |
| 2005/0136624 A1 | 6/2005 | Cheng et al. |
| 2006/0054594 A1 | 3/2006 | Lifka et al. |
| 2006/0099776 A1 | 5/2006 | Dupont |
| 2008/0001169 A1 | 1/2008 | Lochtefeld |
| 2008/0160661 A1 | 7/2008 | Henley |
| 2008/0179547 A1 | 7/2008 | Henley |
| 2009/0007960 A1 | 1/2009 | Ito et al. |

OTHER PUBLICATIONS

Notice of Allowance dated Aug. 9, 2013 in U.S. Appl. No. 12/951,601; 11 Pages.

\* cited by examiner

LOW COST SOLAR CELL MANUFACTURE METHOD EMPLOYING A REUSABLE SUBSTRATE

FIELD OF THE INVENTION

The invention generally relates to the fabrication of solar cells and, more particularly, to methods for creating a single crystal silicon solar cell using a reusable substrate and associated structures.

BACKGROUND

Increasing energy costs and environmental concerns make solar power an attractive alternative to traditional carbon-based energy sources. Solar power is commonly harnessed using a solar cell, which is a device that converts the energy of sunlight into electricity by the photovoltaic effect. Solar cells are manufactured using numerous different types of technology, including crystalline silicon devices, thin film devices, and multiple junction devices, to name a few.

Crystalline silicon devices are generally classified into single crystal silicon solar cells, polycrystal silicon solar cells, and amorphous silicon solar cells, depending on the crystallinity and crystal size in the resulting ingot, ribbon, or wafer used during manufacturing. Single crystal (e.g., monocrystalline) silicon solar cells are generally more efficient than polycrystal (e.g., multicrystalline) silicon solar cells and, therefore, are suitable for high-grade solar cells. However, single crystal silicon solar cells are more expensive to produce than polycrystalline silicon solar cells. As such, there is a need in the art for a method for producing single crystal silicon solar cells in a more cost-efficient manner.

Accordingly, there exists a need in the art to overcome the deficiencies and limitations described hereinabove.

SUMMARY

In a first aspect of the invention, there is a method of forming a photovoltaic cell comprising: forming an intermediate layer on a monocrystalline silicon substrate; forming a monocrystalline silicon layer on the intermediate layer; and forming electrical features in the monocrystalline silicon layer. The method further includes: forming openings in the monocrystalline silicon layer; and detaching the monocrystalline silicon layer from the substrate by selectively etching the intermediate layer through the openings.

In another aspect of the invention, there is a method of forming plural solar cells from a re-usable substrate. The method includes forming a first intermediate layer on the substrate, forming a first single crystal silicon layer on the first intermediate layer, and processing the first single crystal silicon layer as a first solar cell. The method also includes selectively etching the first intermediate layer to detach the first single crystal silicon layer from the substrate, forming a second intermediate layer on the substrate, and forming a second single crystal silicon layer on the second intermediate layer. The method additionally includes processing the second single crystal silicon layer as a second solar cell, and selectively etching the second intermediate layer to detach the second single crystal silicon layer from the substrate.

In another aspect of the invention, there is a semiconductor structure, comprising a single crystal silicon solar cell comprising a top surface with a pattern of etch openings.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

DETAILED DESCRIPTION

The invention generally relates to the fabrication of solar cells and, more particularly, to methods for creating a single crystal silicon solar cell using a reusable substrate and associated structures. In accordance with aspects of the invention, an intermediate layer is formed on a substrate of single crystal silicon, and a layer of single crystal silicon is formed on the intermediate layer. The layer of single crystal silicon is processed, e.g., wired for use as a solar cell or other electronic device. Openings are formed in the processed layer of single crystal silicon, the openings extending down to the intermediate layer. The intermediate layer is selectively etched through the openings until the processed layer of single crystal silicon is detached from the substrate. The detached processed layer of single crystal silicon may be further processed as a solar cell, while the substrate may be refurbished and used again (e.g., reused) to form another solar cell. In this manner, implementations of the invention provide a reusable substrate and method for forming single crystal silicon solar cells.

Figure 1:
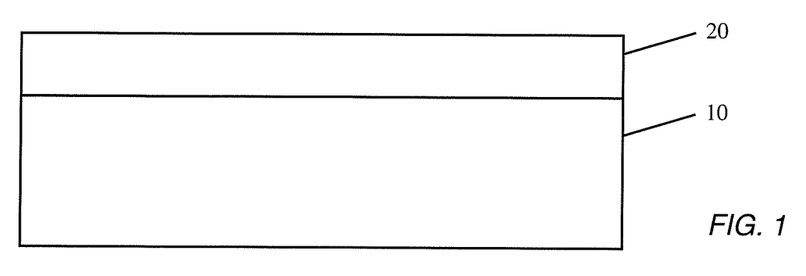
FIGS. 1-3, 4A, 4B, and 5-14 show views of structures and respective processing steps in accordance with aspects of the invention.

FIGS. 1-3, 4A, 4B, and 5-14 show views of structures and respective processing steps in accordance with aspects of the invention. For example, FIG. 1 shows a cross-section view of a semiconductor structure comprising a substrate 10 and an intermediate layer 20 formed on the substrate 10. The substrate 10 is composed of single crystal silicon, and may be formed using conventional methods. In embodiments, the intermediate layer 20 comprises silicon and an impurity, such as, for example, germanium (Ge) or arsenic (As). For example, the intermediate layer 20 may comprise a SiGe layer that is epitaxially grown on the substrate 10, the SiGe layer having a single crystal lattice structure and orientation since it is epitaxially grown from the single crystal silicon substrate 10. In embodiments, the intermediate layer 20 is formed with a thickness of about 10 nm-1 µm; however, the invention is not limited to this thickness, and any suitable thickness may be used within the scope of the invention.

Figure 2:
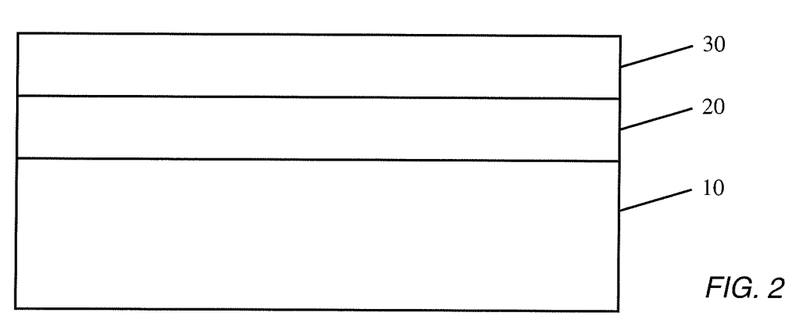

As depicted in FIG. 2, an upper layer 30 is formed on the intermediate layer. In embodiments, the upper layer 30 is composed of single crystal silicon and is formed by epitaxially growing single crystal silicon on the intermediate layer 20. In accordance with aspects of the invention, the upper layer 30 has a single crystal structure since it is epitaxially grown from the single crystal SiGe of the intermediate layer 20. In embodiments, the upper layer is formed with a thickness of about 5 µm-50 µm; however, the invention is not limited to this thickness, and any suitable thickness may be used within the scope of the invention.

Figure 3:
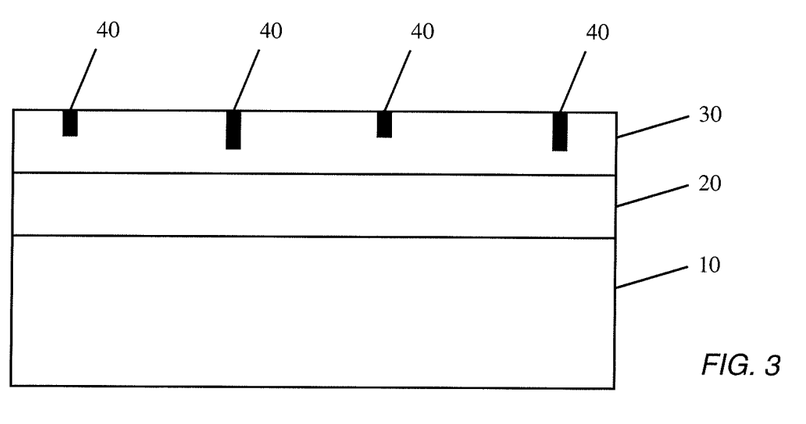

As depicted in FIG. 3, the upper layer 30 is processed as a semiconductor device, and more particularly as a solar cell. For example, wiring 40 and/or other features used in solar cells may be added to (e.g., formed in and/or on) the upper layer 30 using conventional processing techniques.

Figure 4A:
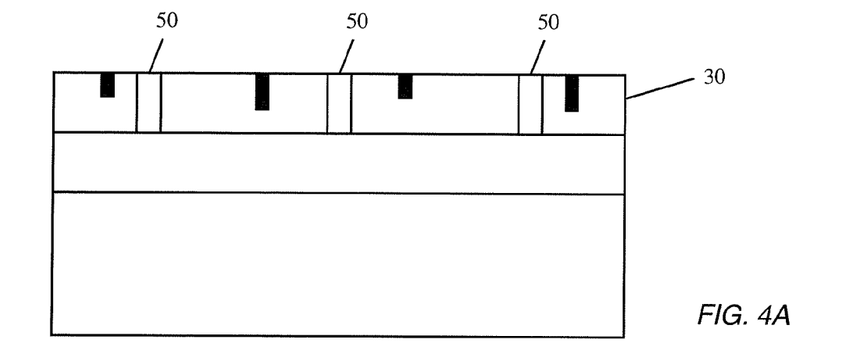

According to aspects of the invention, a plurality of openings 50 are formed in the upper layer 30, as depicted in FIG. 4A. The openings 50 may be formed using conventional semiconductor processing techniques including, but not limited to: applying a photoresist, patterning the photoresist, and etching (e.g., reactive ion etch) the upper layer 30 through the patterned photoresist to form the openings 50. Of course, the invention is not limited to forming the openings 50 in this manner, and other suitable methods such as laser ablation, gas cluster ion beam, etc., may be used within the scope of the invention.

Figure 4B:
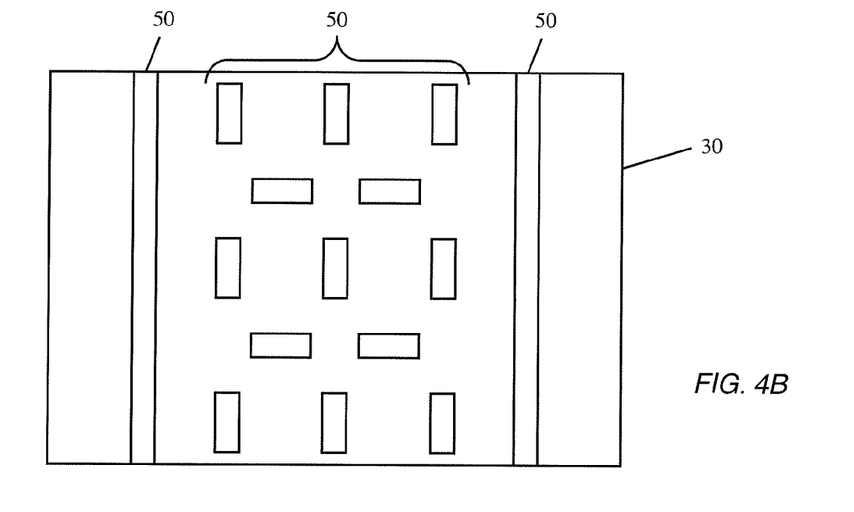

In embodiments, the openings 50 extend through the entirety of the upper layer 30 to the intermediate layer 20. As depicted in FIG. 4B, which is a plan view, any number of openings 50 having any suitable size and shape and any desired spatial orientation may be used within the scope of the invention. For example, the openings 50 may have a width in the range of about 100 nm to about 1 µm; however, the invention is not limited to this width, and any suitable width may be used within the scope of the invention. As discussed in greater detail below, the number of openings 50, size of the openings 50, and spatial orientation of the openings 50 may be chosen based on the thickness of the intermediate layer 20, a composition of the intermediate layer 20, and an etch chemistry.

Figure 5:
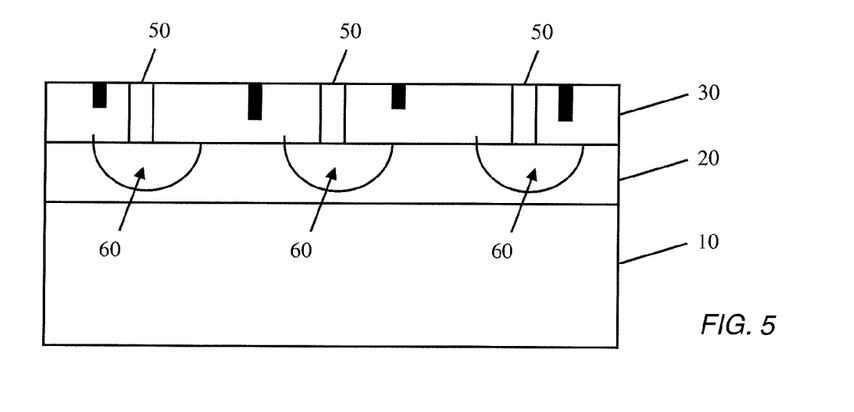
Figure 6:
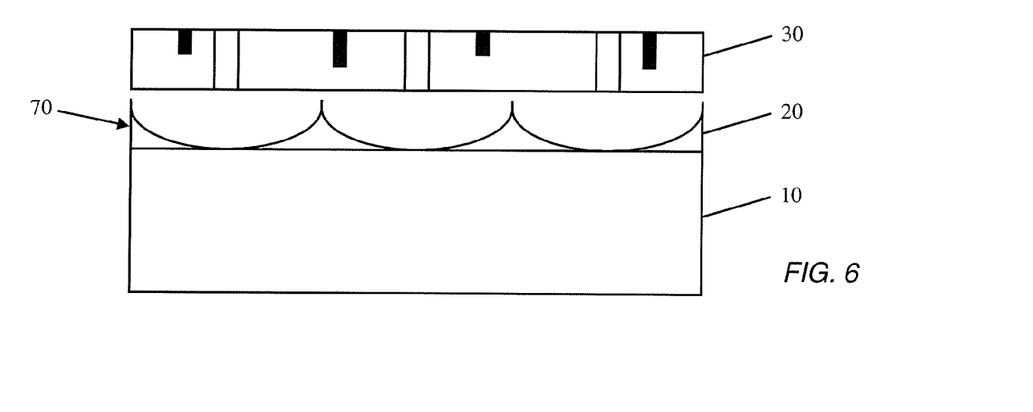

In accordance with aspects of the invention, the intermediate layer 20 is selectively etched through the openings 50 to facilitate detaching the upper layer 30 from the substrate 10, as depicted in FIGS. 5 and 6. In embodiments, an etch process that is highly selective to the material of the intermediate layer 20 is applied to the intermediate layer 20 via the openings 50. More specifically, the etch chemistry and/or other etch process parameters may be chosen so that the etch process removes material of the intermediate layer 20 at a rate faster then material of the upper layer 30. For example, the process of a nitric based etch with dilute hydrofluoric acid has an etch rate of about 100:1 of SiGe compared to Si, and this process may be used within the scope of the invention. The invention is not limited to this process, however, and any suitable highly selective etch may be used within the scope of the invention.

As depicted in FIG. 5, the selective etch produces voids 60 in the intermediate layer 20 adjacent the openings 50. As the selective etch process continues, the voids 60 grow in size and eventually join one another and detach the upper layer 20 from the substrate 10, as shown in FIG. 6. In this manner, the upper layer 30 may be detached and used for its intended purpose, e.g., as a solar cell, while the substrate 10 may be reused to form another solar cell in accordance with the processes already described herein with respect to FIGS. 1-3. The intermediate layer 20, due to its being etched, may be thought of as a sacrificial layer.

A number of parameters may affect the etch time required to detach the upper layer 20 from the substrate 10 via the selective etch. These parameters include, for example, the thickness of the intermediate layer 20, the composition of the intermediate layer 20, the number of openings 50, the size of the openings 50, the spatial orientation of the openings 50 relative to one another, and the etch chemistry. In embodiments, of the invention, at least one of the number of openings 50, the size of the openings 50, the spatial orientation of the openings 50 relative to one another may be selectively predetermined (e.g., optimized) based on at least one of the thickness of the intermediate layer 20, the composition of the intermediate layer 20, and the etch chemistry in order to achieve a particular etch time for detaching the upper layer 20 from the substrate 10. Such optimization may be performed, for example, using a computer simulation based on numerical modeling techniques.

Figure 7:
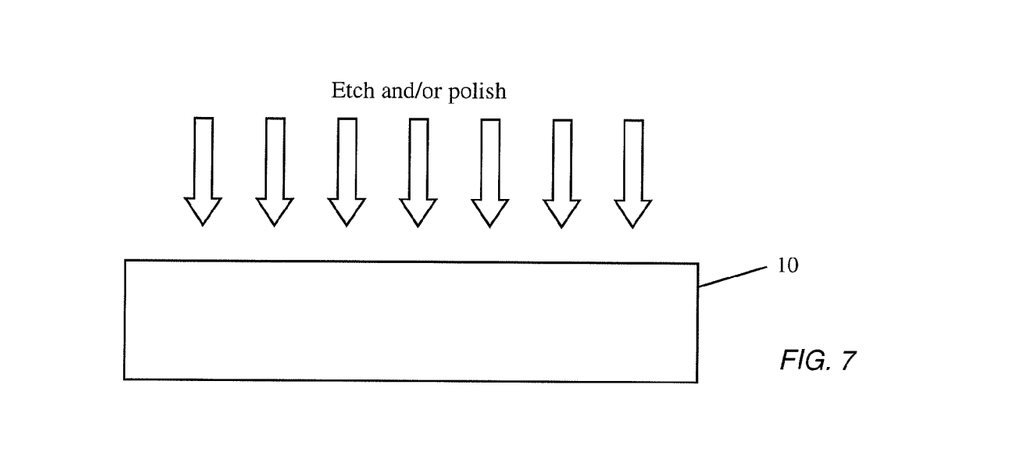

As depicted in FIG. 6, there may be some residual portion 70 of the intermediate layer 20 on the substrate 10 after performing the selective etch. In embodiments, and as depicted in FIG. 7, at least one of an optional additional etch and an optional polishing process may be applied to the top surface of the substrate 10. The polishing process may include, but is not limited to, chemical mechanical polishing (CMP).

Figure 8:
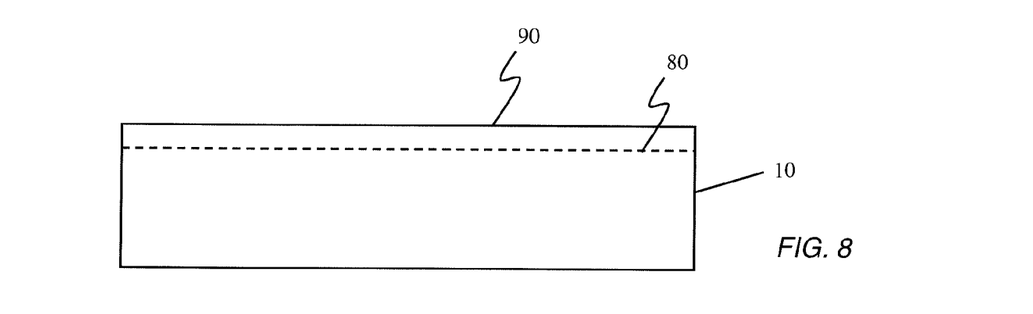

Optionally, as depicted in FIG. 8, the substrate 10 may be regrown to substantially its initial height before reusing the substrate 10 to form another solar cell. For example, single crystal silicon may be epitaxially grown on the substrate 10 to increase the thickness of the substrate from a first dimension indicate by dashed line 80 to a second dimension indicated by top surface 90. In embodiments, the amount of regrowth of the substrate is in the range of about 50 nm to about 5 µm, although the invention is not limited to this amount and any suitable amount of regrowth of the substrate may be performed within the scope of the invention. In either event (e.g., with or without regrowing the substrate 10), the substrate 10 may be reused to form another single crystal silicon device by repeating the steps described with respect to FIGS. 1-3. In this manner, implementations of the invention provide a method and reusable substrate for forming single crystal silicon solar cells.

As discussed above, the intermediate layer 20 is not limited to SiGe. Instead, any other impurity may be used that is capable of undergoing a highly selective etch (e.g., an etch rate of about 50:1, or more, when compared to Si). For example, in embodiments, the intermediate layer 20 may be formed of SiAs, or another suitable composition comprising Si and an impurity, in a manner similar to that described above with respect to FIG. 1.

In accordance with further aspects of the invention, instead of epitaxially growing the intermediate layer 20, the intermediate layer 20 may be formed by implanting an impurity (e.g., Ge, As, etc.) into a portion of the single crystal silicon of the substrate 10 and annealing the structure. The implant parameters (e.g., dosage, implant energy, anneal temperature, etc.) may be selectively chosen based on the implant species and desired thickness of the implanted intermediate layer 20. After forming the intermediate layer 20 by implanting an impurity, the process may proceed as described above with respect to FIGS. 2-8.

Figure 9:
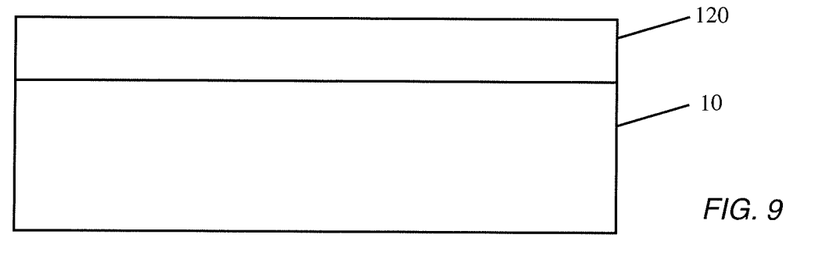

An alternative embodiment is depicted in FIGS. 9-14. More specifically, as shown in FIG. 9, an intermediate layer 120 comprising oxide or nitride is formed on a single crystal silicon substrate 10. The intermediate layer 120 may be composed of any suitable oxide or nitride composition including, but is not limited to, $SiO_2$, $Si_3N_4$, etc. The intermediate layer 120 may be formed in any suitable manner including, but not limited to, chemical vapor deposition (CVD), thermal growing process (e.g., oxidation, nitridation), etc. In embodiments, the intermediate layer 120 is formed with a thickness of about 10 nm-100 nm; however, the invention is not limited to this thickness, and any suitable thickness may be used within the scope of the invention. It is not necessary that the intermediate layer 120 have a single crystalline structure.

Figure 10:
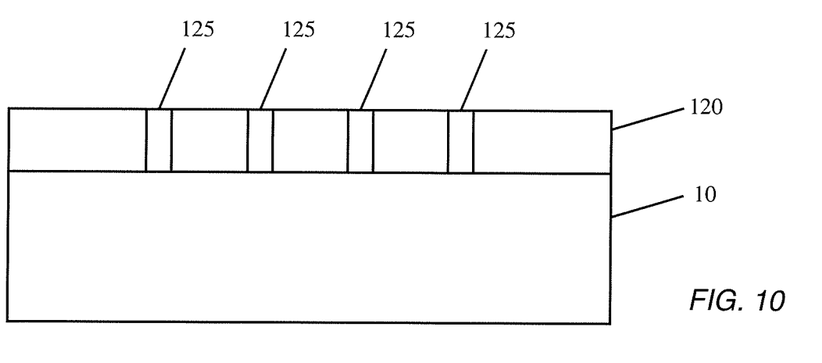

As depicted in FIG. 10, a plurality of holes 125 are formed in the intermediate layer 120. In embodiments, the holes 125 extend through the entirety of the intermediate layer 120 and expose portions of the substrate 10. Any number of holes 125 may be used, and the holes may have any desired size and spatial orientation. In embodiments, the holes 125 are formed using conventional masking and etching techniques, although other techniques such as laser ablation, gas cluster ion beam, etc., may be also used.

Figure 11:
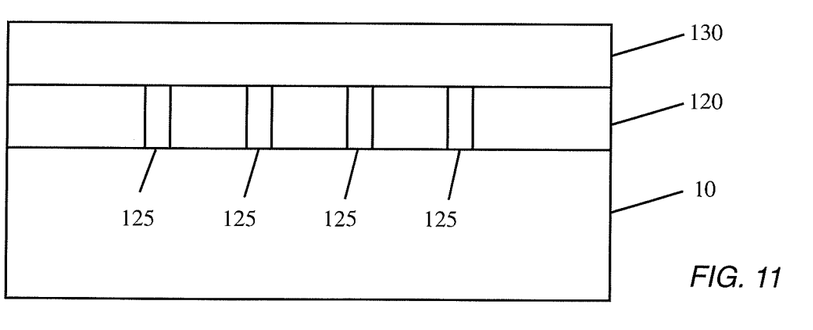

In accordance with aspects of the invention, an upper layer 130 composed of single crystal silicon is formed on the intermediate layer 120. In embodiments, the upper layer 130 is formed by epitaxially growing silicon from the exposed portions of the substrate 10 up through the holes 125 and over the intermediate layer 120. The silicon that forms the upper layer 130 is single crystal silicon since it is epitaxially grown from the single crystal silicon substrate 10.

Figure 12:
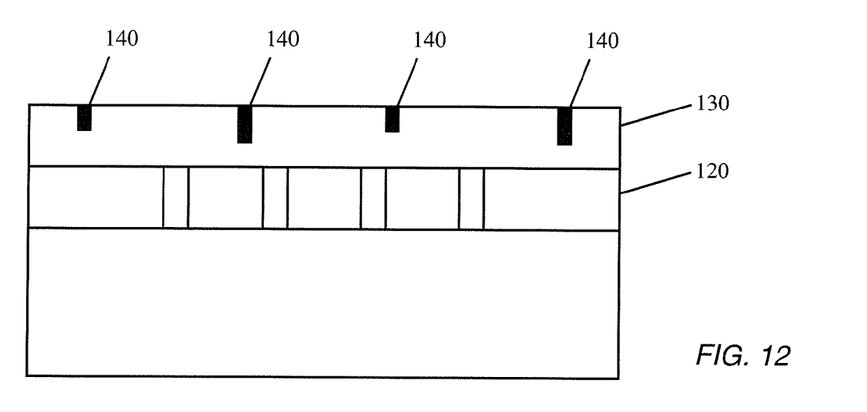

As depicted in FIG. 12, the upper layer 130 is processed as a semiconductor device, and more particularly as a solar cell. For example, wiring 140 and/or other features used in solar cells may be added to (e.g., formed in and/or on) the upper layer 130 using conventional processing techniques.

Figure 13:
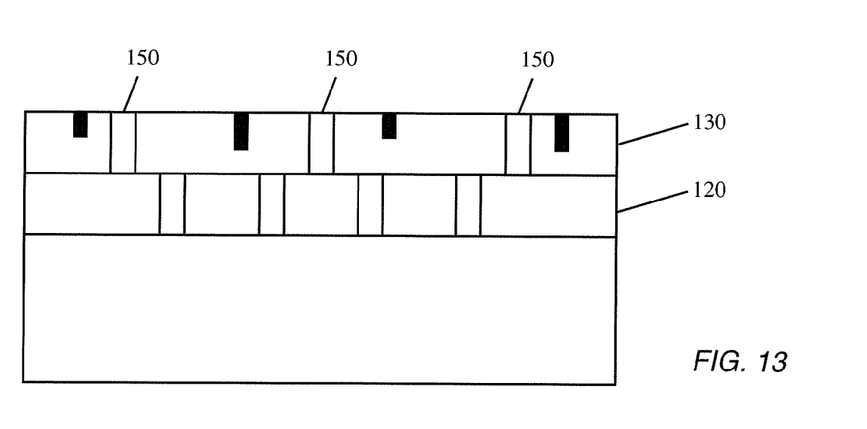

According to aspects of the invention, a plurality of openings 150 are formed in the upper layer 130, as depicted in FIG. 13. The openings 150 may be formed using conventional semiconductor processing techniques including, but not limited to: applying a photoresist, patterning the photoresist, and etching (e.g., reactive ion etch) the upper layer 130 through the patterned photoresist to form the openings 150. Of course, the invention is not limited to forming the openings 150 in this manner, and other suitable methods such as laser ablation, gas cluster ion beam, etc. may be used within the scope of the invention. In embodiments, the openings 150 extend through the entirety of the upper layer 130 to the intermediate layer 120. The openings 150 may be formed in a manner similar to the openings 50 described above with respect to FIG. 4.

Figure 14:
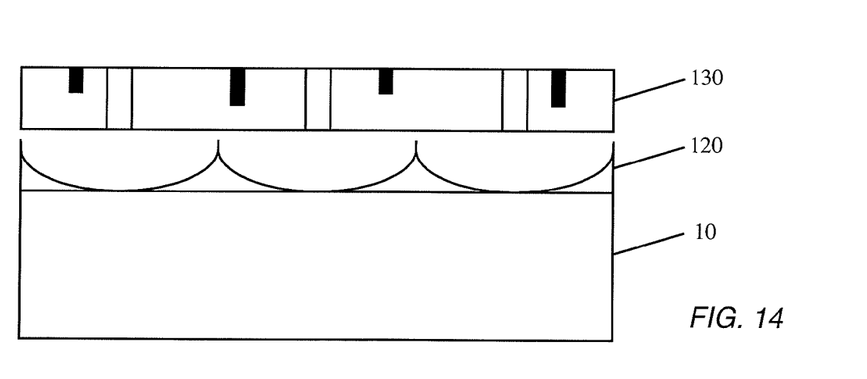

As depicted in FIG. 14, and in accordance with aspects of the invention, the intermediate layer 120 is selectively etched through the openings 150 to facilitate detaching the upper layer 130 from the substrate 10. In embodiments, the selective etch may be performed in a manner similar to that described above with respect to FIGS. 5 and 6, with the etch process being chosen to be highly selective to the material of the intermediate layer 120 (e.g., oxide or nitride) compared to silicon.

In embodiments, similar to that described above with respect to FIGS. 6 and 7, at least one of an optional additional etch and an optional polishing process may be applied to the top surface of the substrate 10. The polishing process may include, but is not limited to, chemical mechanical polishing (CMP). Also optionally, the substrate 10 may be regrown to substantially its initial height, or some other height, before reusing the substrate 10 to form another solar cell. The regrowing may be performed as described above with respect to FIG. 8.

Figure 15:
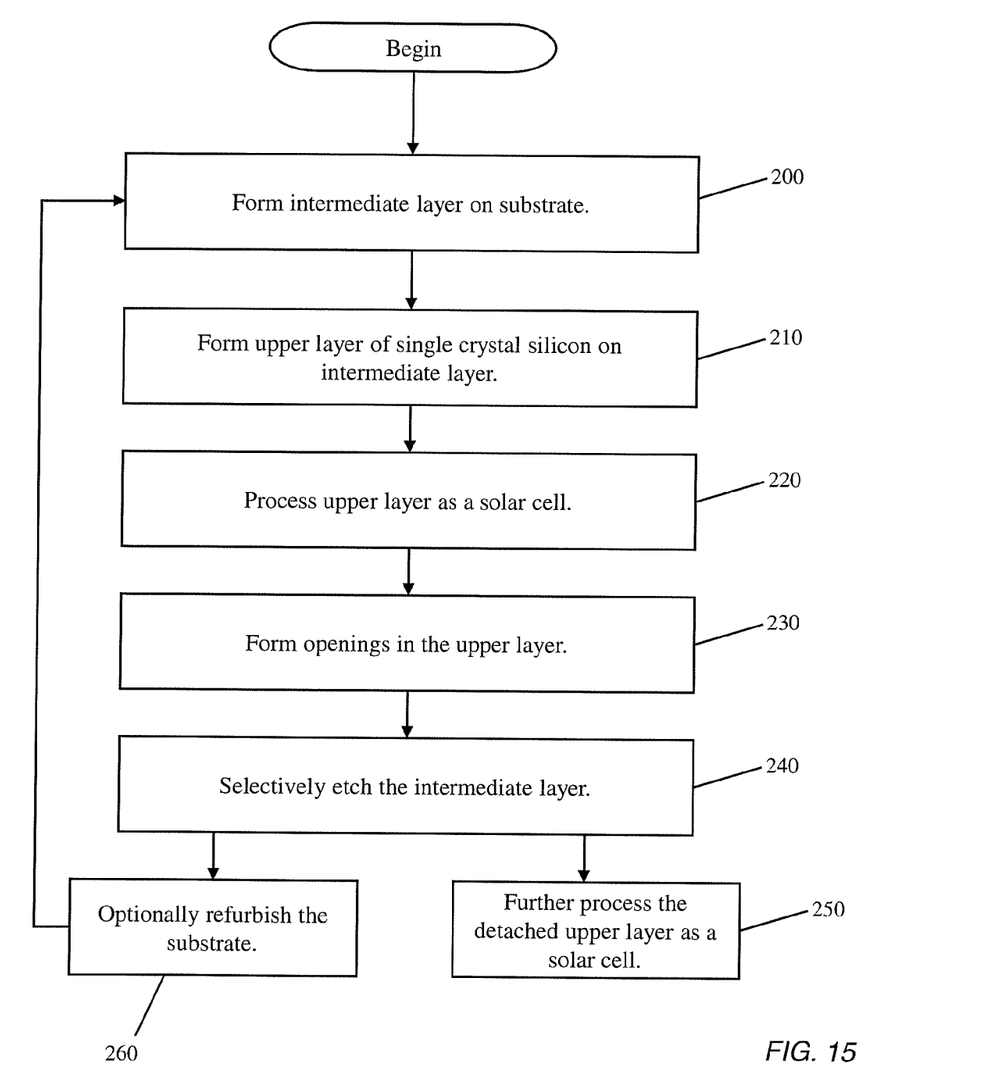
FIG. 15 is a flow diagram of a process in accordance with aspects of the invention.

FIG. 15 shows a flow diagram depicting a method of forming a semiconductor device in accordance with aspects of the invention. At step 200, an intermediate layer is formed on a monocrystalline silicon substrate. In embodiments, the intermediate layer may be formed by epitaxially growing single crystal SiGe or single crystal SiAs on the substrate, as described above with respect to FIG. 2. Alternatively, the intermediate layer may be formed by implanting an impurity (e.g., Ge, As, etc.) into the substrate. Alternatively, the intermediate layer may be formed by depositing or growing oxide or nitride on the substrate, as described above with respect to FIG. 9.

At step 210, an upper layer of monocrystalline silicon is formed on the intermediate layer. In embodiments, the upper layer is formed by epitaxially growing silicon from the intermediate layer, as described above with respect to FIG. 2. Alternatively, the upper layer may be formed by first forming holes in the intermediate layer and then epitaxially growing silicon from the substrate up through the holes and over the intermediate layer, as described above with respect to FIG. 11.

At step 220, the upper layer is processed as a solar cell. In embodiments, wiring and/or other solar cell features are formed in and/or on the upper layer using conventional fabrication techniques, as described above with respect to FIG. 3.

At step 230, openings are formed in the upper layer. In embodiments, the openings are formed in the manner described above with respect to FIG. 4, such as, for example, masking and etching, laser ablation, gas cluster ion beam, etc.

At step 240, the intermediate layer is selectively etched through the openings. In embodiments, the selective etch is performed in a manner described above with respect to FIGS. 5 and/or 14. For example, an etch chemistry that is highly selective to the material of the intermediate layer compared to the surrounding silicon may be chosen to etch voids in the intermediate layer while only minimally affecting the surrounding silicon.

At step 250, the detached upper layer is further processed for use as a solar cell. At step 260, the substrate is optionally refurbished. In embodiments, the optional refurbishment may include, but is not limited to, etching residue from the substrate, polishing the substrate, and regrowing the substrate, as described herein. After the upper layer has been detached and any optional refurbishing has been performed, the process returns to step 200 where the substrate may be reused to form another solar cell.

Figure 16:
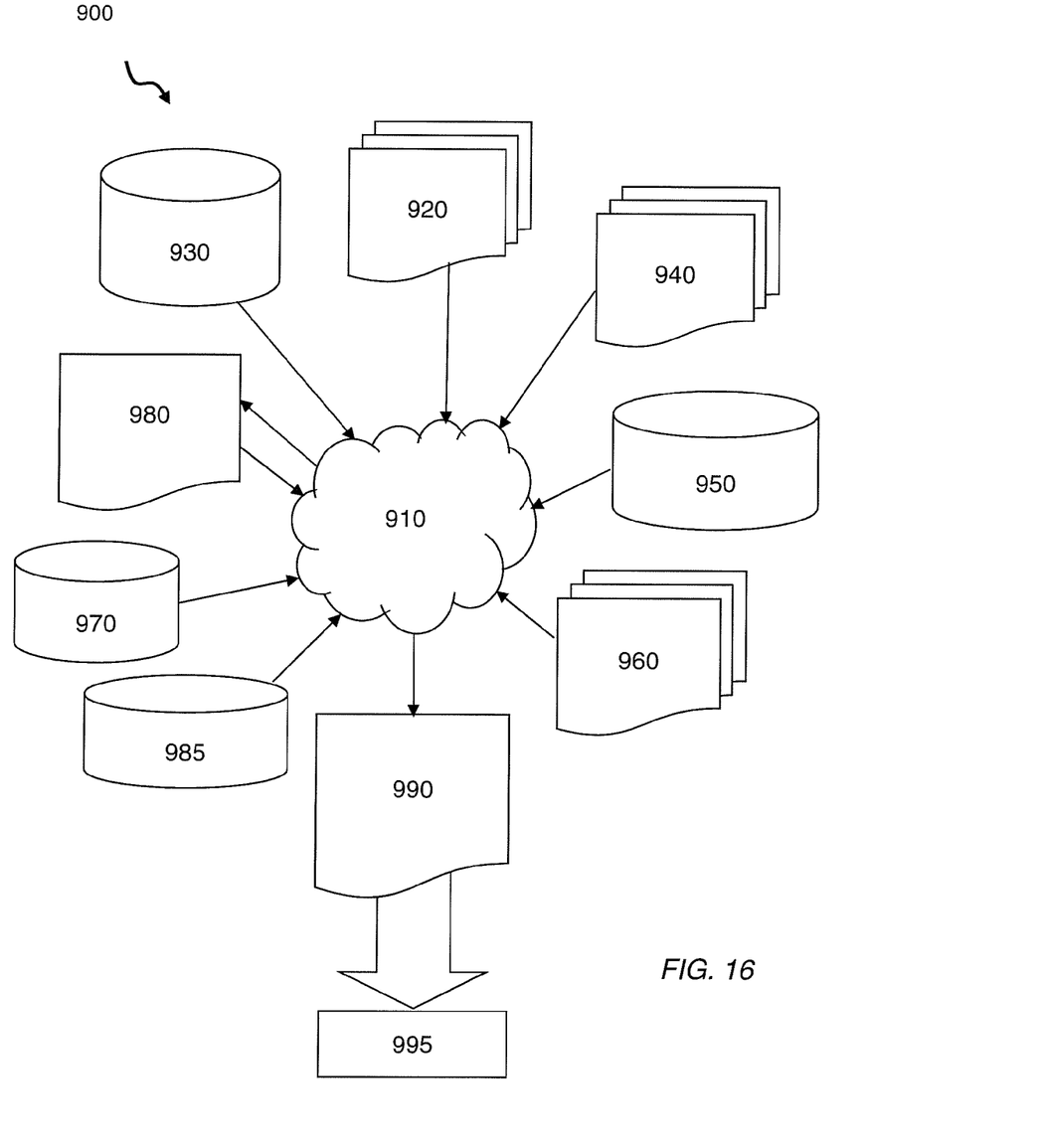
FIG. 16 is a flow diagram of a design process used in semiconductor design, manufacture, and/or test.

FIG. 16 shows a block diagram of an exemplary design flow 900 used for example, in semiconductor IC logic design, simulation, test, layout, and manufacture. Design flow 900 includes processes, machines and/or mechanisms for processing design structures or devices to generate logically or otherwise functionally equivalent representations of the design structures and/or devices described above and shown in FIGS. 1-14. The design structures processed and/or generated by design flow 900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 900 may vary depending on the type of representation being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA) offered by Altera® Inc. or Xilinx® Inc.

FIG. 16 illustrates multiple such design structures including an input design structure 920 that is preferably processed by a design process 910. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIGS. 1-14. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIGS. 1-14 to generate a netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990. Design structure 990 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1-14. In one embodiment, design structure 990 may comprise a compiled, executable HDL simulation model that functionally simulates the devices shown in FIGS. 1-14.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1-14. Design structure 990 may then proceed to a stage 995 where, for example, design structure 990: proceeds to tape-out, is released to manufacturing, is released to a mask house, is sent to another design house, is sent back to the customer, etc.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below, where applicable, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated. Accordingly, while the invention has been described in terms of embodiments, those of skill in the art will recognize that the invention can be practiced with modifications and in the spirit and scope of the appended claims.

What is claimed:

1. A method of forming plural solar cells from a re-usable substrate, comprising:
    forming a first intermediate layer on the substrate, wherein the first intermediate layer is a sacrificial layer comprising one of SiGe and SiAs;
    forming a first single crystal silicon layer on the first intermediate layer;
    processing the first single crystal silicon layer as a first solar cell;
    selectively etching the first intermediate layer to detach the first single crystal silicon layer from the substrate;
    forming a second intermediate layer on the substrate;
    forming a second single crystal silicon layer on the second intermediate layer;
    processing the second single crystal silicon layer as a second solar cell; and
    selectively etching the second intermediate layer to detach the second single crystal silicon layer from the substrate.

2. The method of claim 1, further comprising refurbishing the substrate after the selectively etching the first intermediate layer and prior to the forming the second intermediate layer.

3. The method of claim 2, wherein the refurbishing comprises at least one of:
    etching residue from a surface of the substrate;
    polishing the substrate; and
    re-growing a portion of the substrate.

4. The method of claim 1, further comprising forming openings in the first single crystal silicon layer, wherein the selectively etching the first intermediate layer comprises etching the first intermediate layer through the openings.

5. The method of claim 1, wherein the forming the first single crystal silicon layer comprises epitaxially growing the first single crystal silicon layer on the first intermediate layer; and
    the forming the first intermediate layer comprises one of:
        epitaxially growing the first intermediate layer on the substrate; and
        implanting an impurity into the substrate.

6. The method of claim 1, wherein the forming the first intermediate layer comprises epitaxially growing the one of SiGe and SiAs on the substrate.

7. The method of claim 1, wherein the forming the first intermediate layer comprises implanting an impurity into the substrate.

8. The method of claim 7, wherein the impurity comprises one of Ge and As.

9. The method of claim 1, wherein the second intermediate layer is a sacrificial layer.

10. The method of claim 1, wherein the first intermediate layer is formed with a thickness in a range of 10 nm to 1 $\mu$m.

11. The method of claim 1, wherein the selectively etching the first intermediate layer comprises forming openings in the first single crystal silicon layer, and further comprising determining at least one of: (i) a number of the openings, (ii) a size of the openings, and (iii) a spatial orientation of the openings, wherein the determining is based on (a) a thickness of the first intermediate layer, (b) a composition of the first intermediate layer, and (c) an etch chemistry.

12. The method of claim 1, wherein:
    the processing the first single crystal silicon layer as a first solar cell comprises adding solar cell wiring to the first single crystal silicon layer; and
    the selectively etching the first intermediate layer is performed after the adding solar cell wiring to the first single crystal silicon layer.

13. A method of forming plural solar cells from a re-usable substrate, comprising:
    forming a first sacrificial intermediate layer on the substrate, wherein the first sacrificial intermediate layer comprises one of SiGe and SiAs;
    forming a first single crystal silicon layer on the first sacrificial intermediate layer;
    processing the first single crystal silicon layer as a first solar cell, wherein the processing comprises adding solar cell wiring to the first single crystal silicon layer;
    selectively etching the first sacrificial intermediate layer to detach the first single crystal silicon layer from the substrate, wherein the selectively etching the first sacrificial intermediate layer is performed after the processing the first single crystal silicon layer;
    forming a second sacrificial intermediate layer on the substrate;
    forming a second single crystal silicon layer on the second sacrificial intermediate layer;
    processing the second single crystal silicon layer as a second solar cell; and
    selectively etching the second sacrificial intermediate layer to detach the second single crystal silicon layer from the substrate.

14. The method of claim 13, wherein the forming the first sacrificial intermediate layer comprises epitaxially growing the one of SiGe and SiAs on the substrate.

15. The method of claim 13, wherein the selectively etching the first sacrificial intermediate layer comprises forming openings in the first single crystal silicon layer, and further comprising determining at least one of: (i) a number of the openings, (ii) a size of the openings, and (iii) a spatial orientation of the openings, wherein the determining is based on (a) a thickness of the first sacrificial intermediate layer, (b) a composition of the first sacrificial intermediate layer, and (c) an etch chemistry.

16. The method of claim 13, wherein the first sacrificial intermediate layer is formed with a thickness in a range of 10 nm to 1 $\mu$m.

* * * * *